(12) United States Patent
Yow et al.

(10) Patent No.: US 12,137,545 B2
(45) Date of Patent: Nov. 5, 2024

(54) ELECTROMAGNETIC SHIELD OF AN INTEGRATED CIRCUIT PACKAGE

(71) Applicant: HEWLETT PACKARD ENTERPRISE DEVELOPMENT LP, Spring, TX (US)

(72) Inventors: See Yun Yow, Singapore (SG); Kah Hoe Ng, Singapore (SG); Chien-Shuo Tang, Singapore (SG)

(73) Assignee: Hewlett Packard Enterprise Development LP, Spring, TX (US)

( * ) Notice: Subject to any disclaimer, the term of this patent is extended or adjusted under 35 U.S.C. 154(b) by 207 days.

(21) Appl. No.: 17/932,765

(22) Filed: Sep. 16, 2022

(65) Prior Publication Data

US 2024/0098952 A1    Mar. 21, 2024

(51) Int. Cl.
| | |
|---|---|
| *H05K 9/00* | (2006.01) |
| *H01L 23/473* | (2006.01) |
| *H02M 7/00* | (2006.01) |
| *H05K 7/20* | (2006.01) |

(52) U.S. Cl.
CPC ......... *H05K 9/0088* (2013.01); *H01L 23/473* (2013.01); *H02M 7/003* (2013.01); *H05K 7/20281* (2013.01)

(58) Field of Classification Search
None
See application file for complete search history.

(56) References Cited

U.S. PATENT DOCUMENTS

| | | | | |
|---|---|---|---|---|
| 5,886,876 A | * | 3/1999 | Yamaguchi | H01L 23/3128 361/767 |
| 6,518,660 B2 | | 2/2003 | Kwon et al. | |
| 7,488,903 B2 | * | 2/2009 | Kawagishi | H01L 25/165 174/385 |
| 9,070,793 B2 | * | 6/2015 | Liao | H01L 23/3121 |
| 10,204,869 B2 | * | 2/2019 | Jeong | H01L 23/3157 |
| 11,177,222 B2 | | 11/2021 | Fay et al. | |
| 11,756,897 B2 | * | 9/2023 | Kim | H01L 23/552 257/659 |
| 2002/0113306 A1 | | 8/2002 | Kwon et al. | |
| 2005/0035436 A1 | * | 2/2005 | Novak | H01L 23/50 257/E23.079 |
| 2007/0267734 A1 | * | 11/2007 | Zhao | H01L 21/561 257/E23.092 |
| 2009/0256244 A1 | * | 10/2009 | Liao | H01L 21/568 257/E23.114 |
| 2011/0115059 A1 | * | 5/2011 | Lee | H01L 23/49805 257/659 |

(Continued)

*Primary Examiner* — Courtney L Smith
(74) *Attorney, Agent, or Firm* — Hewlett Packard Enterprise Patent Department

(57) ABSTRACT

Example implementations relate to an integrated circuit (IC) package, an electronic device having the IC package, and a method of assembling the IC package to a printed circuit board (PCB) of the electronic device. The IC package includes a substrate, a chip, and an electromagnetic shield. The chip is coupled to the substrate. The electromagnetic shield is coupled to the substrate such that the chip is enclosed between the substrate and the electromagnetic shield. The electromagnetic shield includes a ferromagnetic material. Further, the electromagnetic shield protrudes beyond the substrate and is electrically grounded to the PCB to prevent an electromagnetic interference (EMI) noise from radiating through the IC package.

20 Claims, 6 Drawing Sheets

(56) References Cited

U.S. PATENT DOCUMENTS

| | | |
|---|---|---|
| 2012/0074559 A1 | 3/2012 | Budell et al. |
| 2018/0012881 A1* | 1/2018 | Scanlan .................. H01L 25/50 |
| 2018/0374776 A1* | 12/2018 | Liu ..................... H01L 23/3737 |
| 2021/0035917 A1 | 2/2021 | Fay et al. |
| 2021/0153340 A1 | 5/2021 | Lee et al. |

\* cited by examiner

ELECTROMAGNETIC SHIELD OF AN INTEGRATED CIRCUIT PACKAGE

BACKGROUND

An electronic device, such as a computer, a networking device, etc., may include an integrated circuit (IC) package coupled to a printed circuit board to execute one or more workloads. Generally, the IC package may include a lid and circuit components, such as a chip and a substrate. The chip may be coupled to the substrate, and the lid may be mounted on the circuit components to shield them from dust, moisture, corrosion, or other conditions which may arise in external environments, and thereby optimize the performance of the circuit components.

BRIEF DESCRIPTION OF THE DRAWINGS

Various examples will be described below with reference to the following figures.

DETAILED DESCRIPTION

Figure 1:
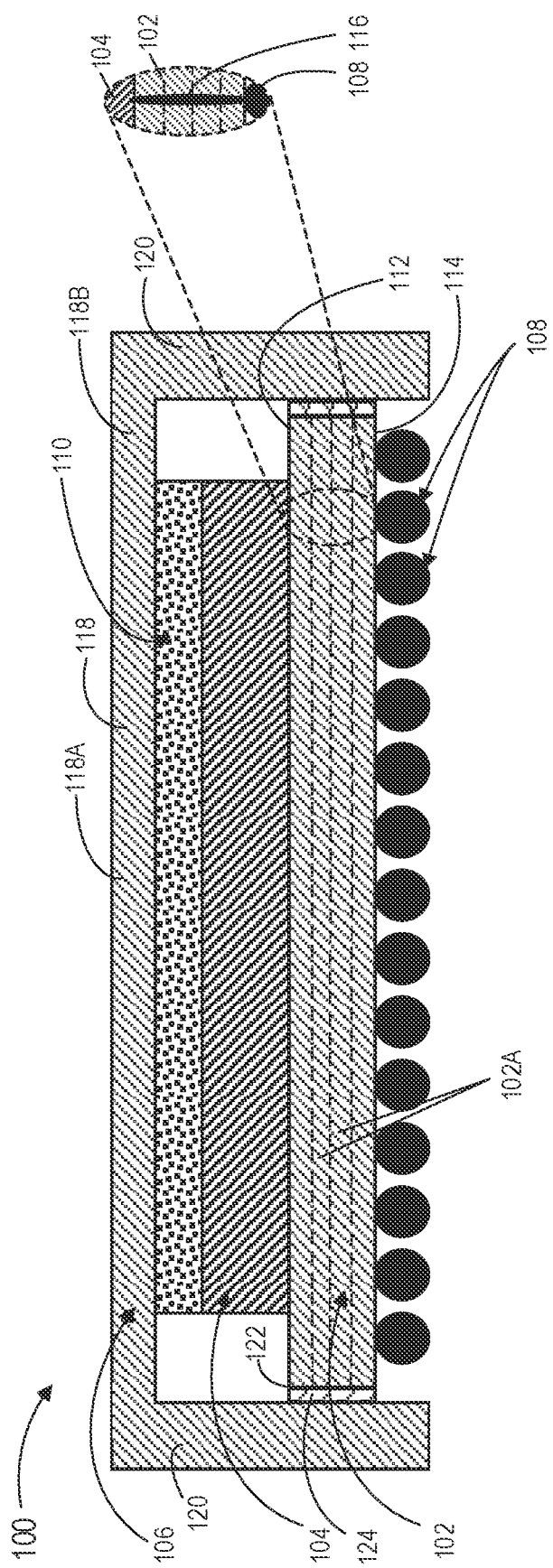
FIG. 1 illustrates a schematic diagram of an IC package according to an example of the present disclosure.

The following detailed description refers to the accompanying drawings. For purposes of explanation, certain examples are described with reference to the components illustrated in FIGS. 1-6. The functionality of the illustrated components may overlap, however, and may be present in a fewer or greater number of elements and components. Moreover, the disclosed examples may be implemented in various environments and are not limited to the illustrated examples. Further, the sequence of operations described in connection with FIG. 6 is an example and is not intended to be limiting. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

As used herein, "chip" refers to a silicon die, such as a central processing unit, a graphics processing unit, application specific integrated circuit, or the like. As used herein "substrate" refers to a base board for supporting a silicon die and connecting the silicon die to electrical contacts. As used herein, "electromagnetic shield" refers to a component (e.g., lid) that surrounds circuit components, such as a chip and a substrate and prevents an electromagnetic interference (EMI) noise from radiating through the component. As used herein, "electronic device" refers to a device, such as a computing device, a networking device, a storage device, or the like, having a printed circuit board (e.g., a mother board), one or more integrated circuit (IC) packages, and one or more electronic components (e.g., capacitors, resistors, or the like). As used herein, "printed circuit board" is an electronic circuit board having a conductive strips etched on dielectric sheets, and to which an IC package and electronic components are attached. As used herein, to "thermally couple" two objects means to provide a thermally conductive pathway between the objects that allows heat to be conducted between the objects. Two objects may be considered to be thermally coupled if any of the following are true: (1) the two objects are in contact with one another (either direct contact, or contact via a TIM), (2) the objects are both thermally coupled to a thermally conductive intermediary (e.g., a heat pipe, heat spreader, etc.) (or to a chain of thermally conductive intermediaries thermally coupled together), or (3) a heat transfer coefficient between the two objects is 5 W m$^{-2}$ K$^{-1}$ or greater.

An IC package may have a lid mounted on circuit components, such as a substrate and a chip, and coupled to the substrate to shield the circuit components from an external environment. Since the lid is only coupled to the substrate and is not grounded, it may only shield the circuit components from an external environment, and may not prevent electromagnetic interference (EMI) noise from radiating through the IC package. Hence, EMI noise emitted from the circuit components of an electronic device may radiate out of the IC package and affect performance of nearby electronic devices. Similarly, EMI noise emitted from circuit components of the nearby electronic devices may radiate into the IC package of the electronic device and affect the performance of the electronic device.

To address such issues related to EMI noise, the electronic device may further include an external case. The external case may function as an EMI shield to prevent EMI noise from radiating through the IC package. For example, the external case may be mounted on the IC package such that it covers the lid and is grounded to a printed circuit board of the electronic device. Thus, the external case may prevent EMI noise from radiating out of the IC package and from radiating into the IC package. However, the external case mounted on the IC package may increase thermal resistance to dissipate heat from the chip. Accordingly, the external case may need to be thermally coupled to the lid via an external thermal interface material (TIM) to transfer the heat from the chip to the external case. Hence, the IC package may be expensive to manufacture and maintain, due to additional elements, such as the external case to shield EMI noise, and the external TIM to dissipate the heat from the chip. Further, the external case may consume additional space within the electronic device. For example, the external case may increase an overall height of the IC package (e.g., by about 2 mm to 4 mm), thereby making it difficult to: i) mount a heat sink over the IC package having the external case, ii) use a taller heat sink to mount on the external case to dissipate the heat from the chip, and iii) mount the IC package within an electronic device having a shorter height. Similarly, the external case may increase an overall width of the IC package (e.g., by about 10 mm to about 30 mm), thereby occupying available space on the printed circuit board. For instance, the space occupied by the IC package could otherwise be used for mounting other electronic components or for routing traces of the printed circuit board.

Additionally, the external case and the external TIM may increase an overall thermal resistance to dissipate the heat from the chip. Further, the external case mounted on the lid may create an empty space between the lid and the external case, where cooling fluid (e.g., air) may be entrapped within the empty space. Since the cooling air is stagnant inside the empty space created between the lid and the external case, the stagnant air may further increase the thermal resistance to dissipate the heat from the chip.

A technical solution to the aforementioned problems may include providing an IC package which can dissipate heat from a chip without requiring additional elements, such as an external case to shield an EMI noise and an external TIM. Accordingly, in one or more examples, the IC package may include an electromagnetic shield (e.g., lid) directly mounted on circuit components, such as a chip and a substrate, and coupled to the substrate such that the chip is enclosed between the substrate and the electromagnetic shield. Further, the electromagnetic shield made of a ferromagnetic material may have sidewall portions, which protrude beyond the substrate and are electrically grounded to a printed circuit board of an electronic device (e.g., host electronic device) to prevent EMI noise from radiating through the IC package. For example, the sidewall portions are soldered to grounding pins of the printed circuit board to electrically ground the electromagnetic shield to the printed circuit board, thereby preventing electrical fields (E-fields) in EMI noise from radiating through the IC package. Further, the ferromagnetic material in the electromagnetic shield may prevent magnetic fields (B-fields) in EMI noise from radiating through the IC package. Accordingly, the IC package does not require additional elements, such as an external case, to shield EMI noise.

Additionally, the electromagnetic shield may be thermally coupled to the chip via an internal thermal interface material (TIM) having a ferromagnetic material. The TIM may directly transfer the heat from the chip to the electromagnetic shield and simultaneously prevent the magnetic fields in EMI noise from radiating through the IC package. Accordingly, the modified IC package may additionally remove the need for an additional element, such as an external TIM, to dissipate the heat from the chip.

Thus, the IC package of the present disclosure may be more economical to manufacture and maintain as compared to an external case because the IC package may require fewer elements. Further, the IC package may consume less space within an electronic device as compared to an external case. For example, the electromagnetic shield may retain a nominal height (e.g., about 2 mm to about 4 mm) on the circuit components of the IC package, thus making the IC package simpler to: i) mount a heat sink over the electromagnetic shield, ii) use a taller heat sink to mount on the electromagnetic shield to dissipate the heat from the chip, and/or iii) mount the IC package within an electronic device having a shorter height. Since the electromagnetic shield has a nominal height on the circuit components of the IC package, it may further provide a stable platform to mount the heat sink over the electromagnetic shield. Further, the electromagnetic shield may retain a nominal width (e.g., 5 mm to about 25 mm) on the circuit components of the IC package, thereby providing more space on the printed circuit board to mount additional electronic components or route traces of the printed circuit board. Further, the IC package having only the electromagnetic shield and the internal TIM may decrease a thermal resistance to dissipate the heat from the chip.

Accordingly, in one or more examples of the present disclosure an integrated circuit (IC) package, an electronic device having the IC package, and a method of assembling the IC package to a printed circuit board of the electronic device are disclosed. The IC package includes a substrate, a chip, and an electromagnetic shield. The chip is coupled to the substrate. The electromagnetic shield is coupled (e.g., soldered or glued) to the substrate such that the chip is enclosed between the substrate and the electromagnetic shield having a ferromagnetic material. Further, the electromagnetic shield protrudes beyond the substrate and is electrically grounded to the printed circuit board to prevent an electromagnetic interference (EMI) noise from radiating through the IC package.

Figure 2:
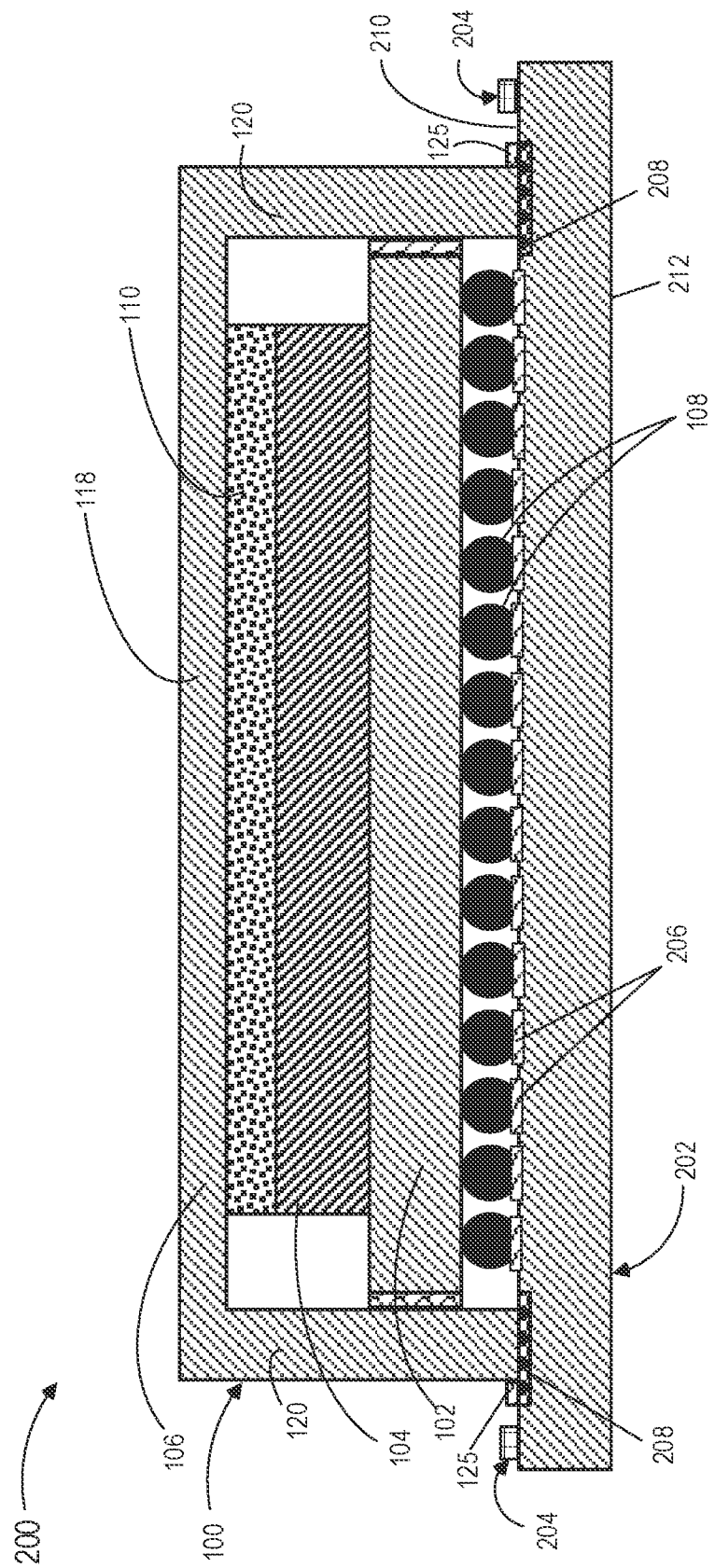
FIG. 2 illustrates a schematic diagram of an electronic device having the IC package of FIG. 1 according to an example of the present disclosure.

Referring to the Figures, FIG. 1 depicts a schematic diagram of an integrated circuit (IC) package 100. The IC package 100 is a modular semiconductor package having a substrate 102, a chip 104 (e.g., IC chip), an electromagnetic shield 106, and electrical contacts 108. In some examples, the IC package 100 may additionally include a thermal interface material (TIM) 110. In one or more examples, one or more IC packages 100 may be mounted on and coupled to a printed circuit board (PCB) 202 of an electronic device 200 (as shown in FIG. 2), such as a computer (e.g., server, storage device, etc.), networking device (e.g., transceiver, wireless access point, router, switch, etc.), or the like. In such examples, each of the one or more IC packages 100 may be instructed to execute one or more workloads.

In some examples, the substrate 102 may include one or more layers 102A of a base board for connecting the chip 104 (e.g., a silicon die) to the substrate 102. Further, the substrate 102 may be used for connecting the chip 104 to the electrical contacts 108. In other words, the substrate 102 is utilized in the packaging of the chip 104 (e.g., bare IC chip) or may function as an interfacing component to connect the chip 104 and the PCB 202 of the electronic device 200 to each other. For example, the substrate 102 may hold the chip 104, provide a link (via electrical routing of the substrate 102) between the chip 104 and the PCB 202, and safeguard, support, and reinforce the chip 104 on the substrate 102.

The chip 104 may be a bare silicon die, which may be mounted on and coupled to the substrate 102, e.g., a top surface 112 of the substrate 102. For example, the chip 104 may be coupled to the substrate 102 using electrical connectors 116, such as wirebond connectors or flipchip connectors. The wirebond connectors may include wires to connect the chip 104 to the substrate 102 and the flipchip connectors may include electrical bumps to connect the chip 104 to the substrate 102. In the example of FIG. 1, the chip 104 is coupled to the substrate 102 using electrical bumps. In some examples, the chip 104 may be a central processing unit (CPU), a graphics processing unit (GPU), an application specific integrated circuit, power supply chips, memory chips, or the like. In the example of FIG. 1, the chip 104 is a CPU. Further, the chip 104 may be connected to the electrical contacts 108 via the electrical connectors 116. For example, the electrical contacts 108 may be coupled to the electrical connectors 116 and protrude outwards beyond the substrate 102, e.g., from a bottom surface 114 of the substrate 102. In some examples, the electrical contacts 108 is one of solder balls of a ball grid array package, sockets of a land grid array package, or pins of a pin grid array package. In other words, the IC package 100 may be a ball grid array package, a land grid array package, a pin grid array package, or the like. In the example of FIG. 1, the electrical contacts 108 is solder balls.

The electromagnetic shield 106 may be used to protect circuit components, e.g., the substrate 102 and the chip 104, from dust, moisture, corrosion, or other conditions which may arise in external environments, and additionally prevent EMI noise from radiating through the IC package 100. Accordingly, the electromagnetic shield 106 may protect the circuit components from malfunctioning due to EMI noise. The electromagnetic shield 106 may be a lid having a cover portion 118 and sidewall portions 120 extending from the cover portion 118. As used herein, "cover portion" refers to top portion of the electromagnetic shield 106. As used herein, "sidewall portions" refers to leg portions extended from the top portion of the electromagnetic shield 106. In some examples, the cover portion 118 includes a first section 118A and a second section 118B extending from the first section 118A. As used herein, "first section" refers to a mid-region in the cover portion 118 of the electromagnetic shield 106, which may be thermally coupled (e.g., directly coupled) to a chip (not shown). As used herein, "second section" refers to an outer region in the cover portion 118, which is not thermally coupled (e.g., directly coupled) to the chip. The first section 118A may be a central section of the cover portion 118 and the second section 118B may be an outer section of the cover portion 118. In one or more examples, the electromagnetic shield 106 may include ferromagnetic material, e.g., iron, cobalt, nickel, or the like. In some examples, the ferromagnetic material in the electromagnetic shield 106 may provide magnetic permeability properties to prevent magnetic fields (B-fields) from radiating through the electromagnetic shield 106.

The electromagnetic shield 106 may be mounted on the substrate 102 such that the chip 104 is enclosed between the substrate 102 and the electromagnetic shield 106. In one or more examples, when the electromagnetic shield 106 is mounted on the substrate 102, the first section 118A of the electromagnetic shield 106 may be disposed in direct thermal contact with the TIM 110 and the second section 118B may be disposed in indirect thermal contact with the TIM 110. In other words, the first section 118A may be thermally coupled to the TIM 110 and the second section 118B may thermally coupled to the TIM 110 via the first section 118A. Further, the sidewall portions 120 of the electromagnetic shield 106 may be coupled to peripheral end portions 122 of the substrate 102 using a thermally conductive glue, a solder, or the like. In the example of FIG. 1, the substrate 102 is coupled to the electromagnetic shield 106 using a solder 124. In one or more examples, the sidewall portions 120 of the electromagnetic shield 106 may further protrude outwards beyond the substrate 102, e.g., about 0.5 mm to 1 mm from the bottom surface 114 of the substrate 102. In one or more examples, the protruded sidewall portions 120 may be electrically grounded to the PCB of the electronic device 200 to prevent electrical fields (E-fields) from radiating through the electromagnetic shield 106. It may be noted herein that the B-fields and the E-fields may be collectively referred to as EMI noise.

Further, as discussed herein, the TIM 110 may be disposed between the chip 104 and the first section 118A of the electromagnetic shield 106. In some examples, the chip 104 is thermally coupled to the first section 118A in the cover portion 118 of the electromagnetic shield 106 via the TIM 110 to dissipate heat from the circuit components to the electromagnetic shield 106. In one or more examples, the TIM 110 includes a ferromagnetic material to further prevent EMI noise, e.g., B-fields from radiating through the IC package 100.

FIG. 2 depicts a schematic diagram of an electronic device 200 having the IC package 100 of FIG. 1. The electronic device 200 may be a computer (e.g., server, storage device, etc.), networking device (e.g., transceiver, wireless access point, router, switch, etc.), or the like. In the example of FIG. 2, the electronic device 200 is a transceiver. In some examples, the electronic device 200 includes one or more IC packages 100, a PCB 202 (e.g., a mother board), and one or more electronic components 204. In some examples, the PCB 202 and the one or more electronic components 204 may be collectively referred to as a circuit assembly of the electronic device 200.

As discussed herein in the example of FIG. 1, the IC package 100 includes a substrate 102, a chip 104, an electromagnetic shield 106, electrical contacts 108, and a TIM 110. The chip 104 is mounted on and coupled to the substrate 102. The TIM 110 is thermally coupled to the chip 104. The electromagnetic shield 106 is mounted on and coupled to the substrate 102 such that the chip 104 and the TIM 110 are enclosed between the substrate 102 and the electromagnetic shield 106. The electromagnetic shield 106 includes ferromagnetic material and includes a cover portion 118 and sidewall portions 120. The sidewall portions 120 protrude outwards beyond the substrate 102, e.g., about 0.5 mm to 1 mm from the bottom surface 114 (as shown in FIG. 1) of the substrate 102.

The PCB 202 is an electronic circuit board having conductive strips 206 and grounding pins 208 that are disposed spaced apart from each other and etched along a top surface 210 of the PCB 202. The conductive strips 206 may be further connected to traces (not shown) in the PCB 202 to create electrical paths and signal paths to allow the chip 104 of IC package 100 to communicate with other devices (not shown) that are connected to the PCB 202, execute or process instructions, receive electrical power, or the like. In one or more examples, the PCB 202, e.g., a bottom surface 212 of the PCB 202 may be mounted on a chassis (not shown) of the electronic device 200.

The IC package 100 is mounted on the PCB 202 and the electrical contacts 108 of the substrate 102 are coupled to the conductive strips 206 of the PCB 202. In some examples, a solder reflow technique may be used to couple the electrical contacts 108 to the conductive strips 206. Further, the protruded sidewall portions 120 of the electromagnetic shield 106 are electrically grounded to the PCB 202 such that the substrate 102 and the chip 104 are completely covered to shield the circuit components from the external environments and additionally prevent EMI noise from radiating through the IC package 100. In some examples, the sidewall portions 120 are disposed on the PCB 202 coupled to grounding pins 208 of the PCB 202 using a solder 125, to electrically ground the electromagnetic shield 106 to the PCB 202. Further, the grounding pins 208 of the PCB 202 may be connected to grounding wires (not shown) of the electronic device 200. In one or more examples, the electronic components 204 may include capacitors, resistors, or the like. In some examples, the electronic components 204 may be disposed spaced apart from each other and coupled to the PCB 202.

During the operation of the electronic device 200, the circuit components of the IC package 100, e.g., the chip 104 and/or the substrate 102 of the IC package 100, may emit EMI noise. Typically, such EMI noise may radiate out of the IC package 100 and affect performance of nearby electronic devices. Similarly, EMI noise that is emitted from other circuit components of nearby electronic devices may radiate through the IC package 100 and affect the performance of the circuit components of the electronic device 200. However, in accordance to the present disclosure, the electromagnetic shield 106 may prevent EMI noise from radiating through the IC package 100. For example, the sidewall portions 120 may ground the E-fields in EMI noise that is either emitted by the circuit components of the electronic device 200 or by other circuit components of nearby electronic devices to the grounding pins 208 of the PCB 202, and thereby prevent the E-fields from radiating through the electromagnetic shield 106. Further, the ferromagnetic material may provide magnetic permeability properties to the electromagnetic shield 106, and thereby prevent magnetic fields (B-fields) in EMI noise that is emitted by either the circuit components of the electronic device 200 or other circuit components of nearby electronic devices from radiating through the electromagnetic shield 106. Accordingly, the electromagnetic shield 106 may protect the circuit components of the IC package 100 from malfunction due to EMI noise, and thereby enhance the performance of the electronic device 200.

In some examples, the IC package 100 may further generate heat during its operation. In such examples, the TIM 110 which is thermally coupled to the chip 104 and the electromagnetic shield 106 may transfer the heat from the chip 104 to the electromagnetic shield 106. Thus, the IC package 100 of the present disclosure may additionally perform a function of thermal management of the electronic device 200.

Since the electromagnetic shield 106 including the ferromagnetic material, is directly mounted on the circuit components and electrically grounded to the PCB 202, the IC package 100 of the present disclosure may be more economical to manufacture and maintain, as compared to an external case because the IC package 100 may require fewer elements. Further, the IC package 100 having only the electromagnetic shield 106 and the TIM 110 may decrease a thermal resistance to dissipate the heat from the chip 104.

Figure 3:
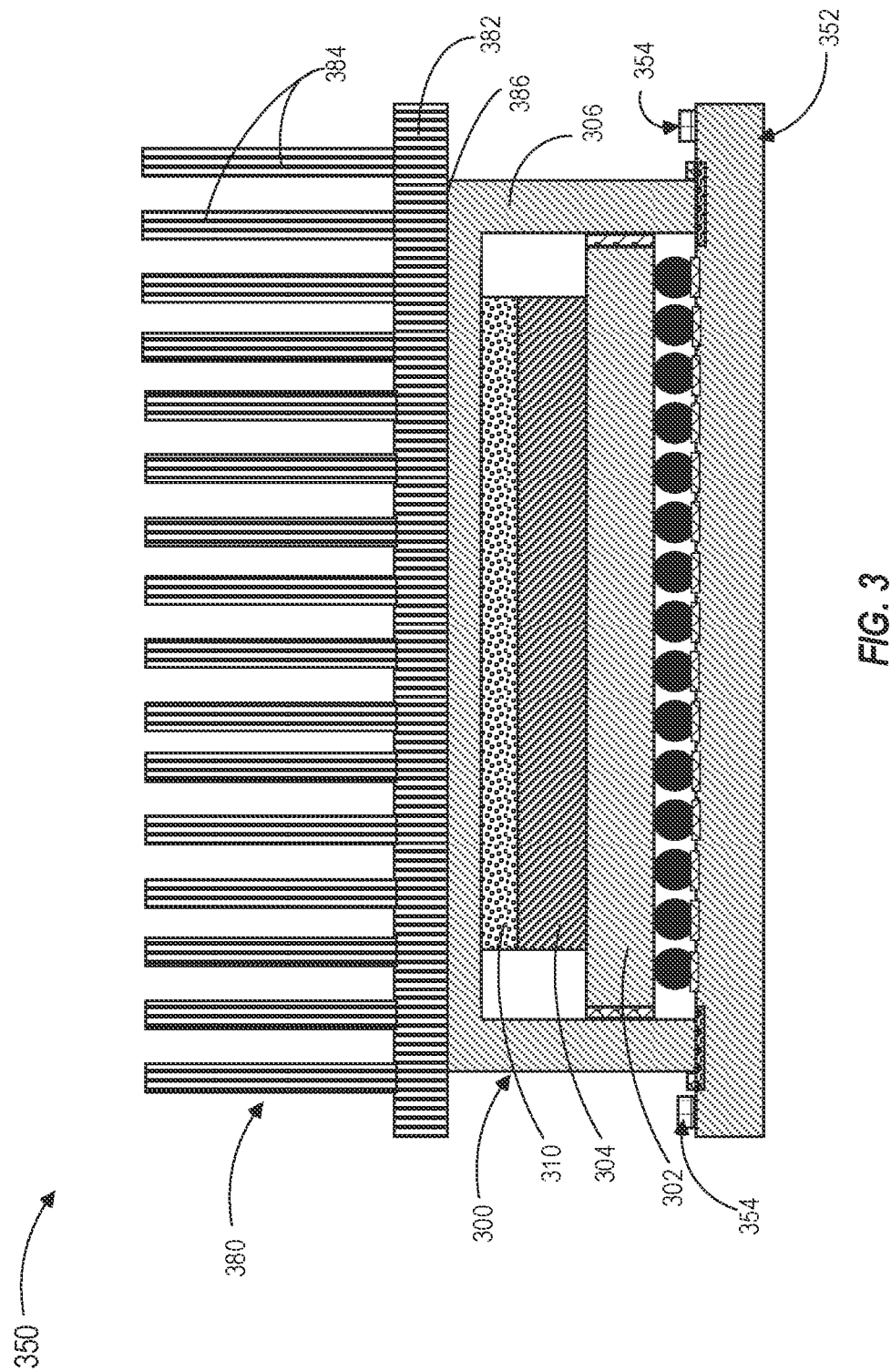
FIG. 3 illustrates a schematic diagram of an electronic device having an IC package and a heat sink according to an example of the present disclosure.

FIG. 3 depicts a schematic diagram of an electronic device 350 having an IC package 300, a PCB 352, and one or more electronic components 354, and a heat sink 380. The IC package 300 includes a substrate 302, a chip 304, an electromagnetic shield 306, electrical contacts 308, and a TIM 310.

The IC package 300 is one configuration of the IC package 100 described above. Thus, various component of the IC package 300 may be similar components of the IC package 100 described above. The above descriptions of components of the IC package 100 are applicable to the similar components of the IC package 300, and thus duplicative descriptions are omitted below to improve clarity. Similarly, components of the IC packages 100 and 300 are given reference numbers having the same last two digits, such as 102 and 302. Although the IC package 300 may be one configuration of the IC package 100, the IC package 100 is not limited to the IC package 300.

Similarly, the PCB 352 and one or more electronic components 354 of the electronic device 350 is one configuration of the PCB 352 and one or more electronic components 354 described above. Thus, the PCB 352 and the one or more electronic components 354 may be similar to PCB 202 and the one or more electronic components 204, and thus duplicative descriptions are omitted below to improve clarity.

In some examples, the heat sink 380 may be used to dissipate the heat from an electromagnetic shield 306 of the IC package 300 to a cooling fluid (e.g., air). In one or more examples, the heat sink 380 may include a base 382 and a plurality of fins 384 coupled to the base 382. As used herein the term "heat sink" refers to a subset of thermal devices that are configured to receive heat from at least one component via conduction and dissipate that heat into the cooling fluid. In the example of FIG. 3, the base 382 is thermally coupled to an outer surface 386 of the electromagnetic shield 306 and the plurality of fins 384 protrudes outwards from the base 382. For example, the base 382 may be thermally coupled to the electromagnetic shield 306 using a thermally conductive glue (not shown). The base 382 may conduct heat from the electromagnetic shield 306 and transfer the heat to the plurality of fins 384. In such examples, the cooling fluid flowing over the plurality of fins 384 may further dissipate the heat from the heat sink 380. In some other examples, a cold plate may be thermally coupled to the outer surface 386 of the electromagnetic shield 306, instead of or along with the heat sink 380 to dissipate the heat from the IC package 300. As used herein "cold plate" refers specifically to a subset of thermal devices that are configured to receive heat from at least one component (e.g., chip) via conduction and to dissipate that heat into a flow of liquid coolant (e.g., water).

During the operation of the electronic device 350, the chip 304 may generate heat. Such heat is undesirable because it may negatively impact the operation of the IC package 300. For example, the heat may cause physical damage to the chip 304, degrade performance, reliability, or life expectancy of the IC package 300, and in some cases the heat may even cause failure of the electronic device 350. Accordingly, the TIM 310 may transfer the heat from the chip 304 to the electromagnetic shield 306. Further, the electromagnetic shield 306 may transfer the heat from the electromagnetic shield 306 to the base 382 of the heat sink 380. Further, the base 382 may transfer the heat to the plurality of fins 384 and the cooling fluid flowing over the plurality of fins 384 may dissipate the heat from the heat sink 380.

Since the IC package 300 does not include additional components, e.g., an external case to shield EMI noise and an external TIM to dissipate heat from the chip, the IC package 300 of the present disclosure may consume less space within the electronic device 350 as compared to the external case and external TIM. For example, the electromagnetic shield 306 may retain a nominal height (e.g., about 2 mm to about 4 mm) on the circuit components of the IC package 300, thus making the IC package 300 simpler to: i) mount the heat sink 380 over the electromagnetic shield, ii) use a taller heat sink 380 to mount on the electromagnetic shield 306 to dissipate the heat from the chip 304, and/or iii) mount the IC package 300 within the electronic device 350 having a shorter height. Further, since the electromagnetic shield 306 has a nominal height on the circuit components, it may further provide a stable platform to mount the heat sink 380 over the electromagnetic shield 306. Additionally, the electromagnetic shield 306 may retain a nominal width (e.g., 5 mm to about 25 mm) on the circuit components of the IC package 300, thereby providing more space on the PCB 352 for mounting additional electronic components or route the traces (not shown) of the PCB 352.

Figure 4:
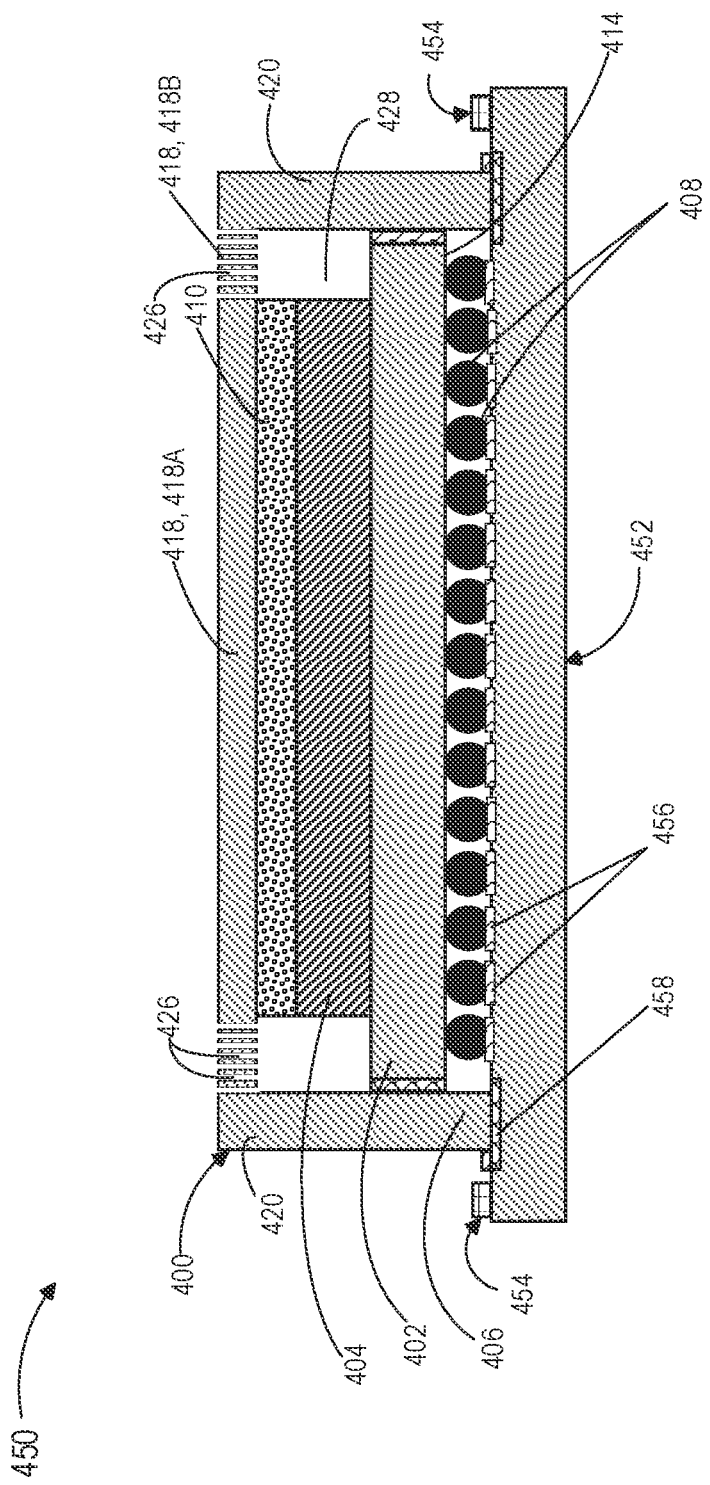
FIG. 4 illustrates a schematic diagram of an electronic device having an IC package according to another example of the present disclosure.

FIG. 4 depicts a schematic diagram of an electronic device 450 having an IC package 400, a PCB 452 (e.g., a mother board), and one or more electronic components 454. The electronic device 450 may be a computer, a networking device, or the like. In one or more examples, the IC package 400 includes a substrate 402, a chip 404, an electromagnetic shield 406, electrical contacts 408, and a TIM 410.

The substrate 402, the chip 404, the electrical contacts 408, and the TIM 410 of the IC package 400 are similar to the substrate 102, the chip 104, the electrical contacts 108, and the TIM 110, respectively of the IC package 100 as described in the example of FIG. 1. Thus, the above descriptions of components of the IC package 100 are applicable to the similar components of the IC package 400, and thus duplicative descriptions are omitted below to improve clarity.

In one or more examples, the chip 404 is mounted on and coupled to the substrate 402, and the TIM 410 is disposed in thermal contact with the chip 404, as described in the example of FIGS. 1-2. In some examples, the electromagnetic shield 406 may be a lid having a cover portion 418 and sidewall portions 420 extending from the cover portion 418. The cover portion 418 includes a first section 418A and a second section 418B extending from the first section 418A. For example, the first section 418A may be a central section and the second section 418B may be an outer section of the cover portion 418. In some examples, the electromagnetic shield 406 may include ferromagnetic material e.g., iron, cobalt, nickel, or the like.

In one or more examples, the electromagnetic shield 406 is mounted on and coupled to the substrate 402 such that the chip 404 is enclosed between the substrate 402 and the electromagnetic shield 406. In one or more examples, when the electromagnetic shield 406 is mounted on the substrate 402, the first section 418A of the electromagnetic shield 406 may be disposed in direct thermal contact with the TIM 410 and the second section 418B may be disposed in indirect thermal contact with the TIM 410. In some examples, the second section 418B in the cover portion 418 has a plurality of apertures 426 to further dissipate the heat from the chip 404, e.g., from an empty space 428 in the IC package 100 to a cooling fluid (not shown). The plurality of apertures 426 may be formed using stamping, milling, or any suitable fabrication method. It may be noted herein that the empty space 428 may correspond to a region formed between the electromagnetic shield 406 and circuit components, e.g., the substrate 402, the chip 404, and the TIM 410. In some examples, each aperture of the plurality of apertures 426 has a diameter of about 0.5 millimeters (mm) to about 3 mm. In one or more examples, the diameter of each aperture of the plurality of apertures 426 may be designed based on a frequency of EMI noise emitted from the IC package 400 so as to prevent leakage of EMI noise through the plurality of apertures 426. For example, the diameter of the plurality of apertures 426 may be designed to be larger to prevent leakage of EMI noise having a lower frequency. In other words, the diameter of the plurality of apertures 426 diameter may be inversely related to the frequency of the EMI noise. In the example of FIG. 4, each of the plurality of apertures 426 is shown to be circular, but it will be understood that each of the plurality of apertures 426 may have any suitable shape (e.g., elliptical, rectangular, etc.)

The electromagnetic shield 406, when mounted on and coupled to the substrate 402, may protect the circuit components from dust, moisture, corrosion, or other conditions which may arise in external environments. Further, the sidewall portions 420 of the electromagnetic shield 406 may protrude beyond the substrate 402 e.g., a bottom surface 414 of the substrate 402.

In one or more examples, the IC package 400 is mounted on and coupled to the PCB 452 of the electronic device 450. For example, the electrical contacts 408 of the substrate 402 is soldered to conductive strips 456 in the PCB 452 of the electronic device 450, as discussed in the example of FIG. 2. Further, the protruded sidewall portions 420 of the electromagnetic shield 406 is electrically grounded to grounding pins 458 of the PCB 452 to prevent electrical fields (E-fields) from radiating through the electromagnetic shield 406. Further, the ferromagnetic material in the electromagnetic shield 406 may provide magnetic permeability property to prevent magnetic fields (B-fields) from radiating through the electromagnetic shield 406. Accordingly, the electromagnetic shield 406 may protect the circuit components from malfunction due to EMI noise.

Figure 5:
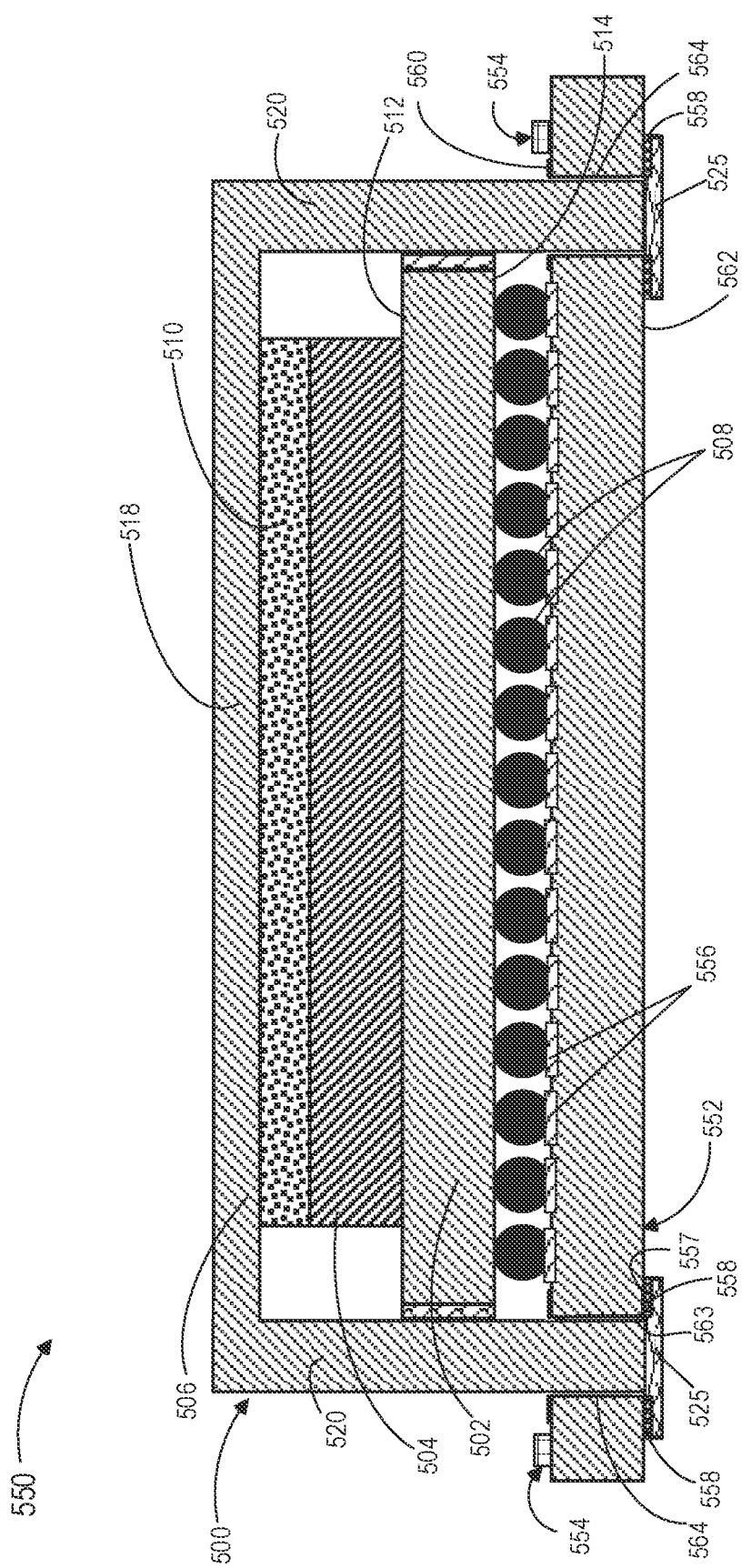
FIG. 5 illustrates a schematic diagram of an electronic device having an IC package according to yet another example of the present disclosure.
Figure 6:
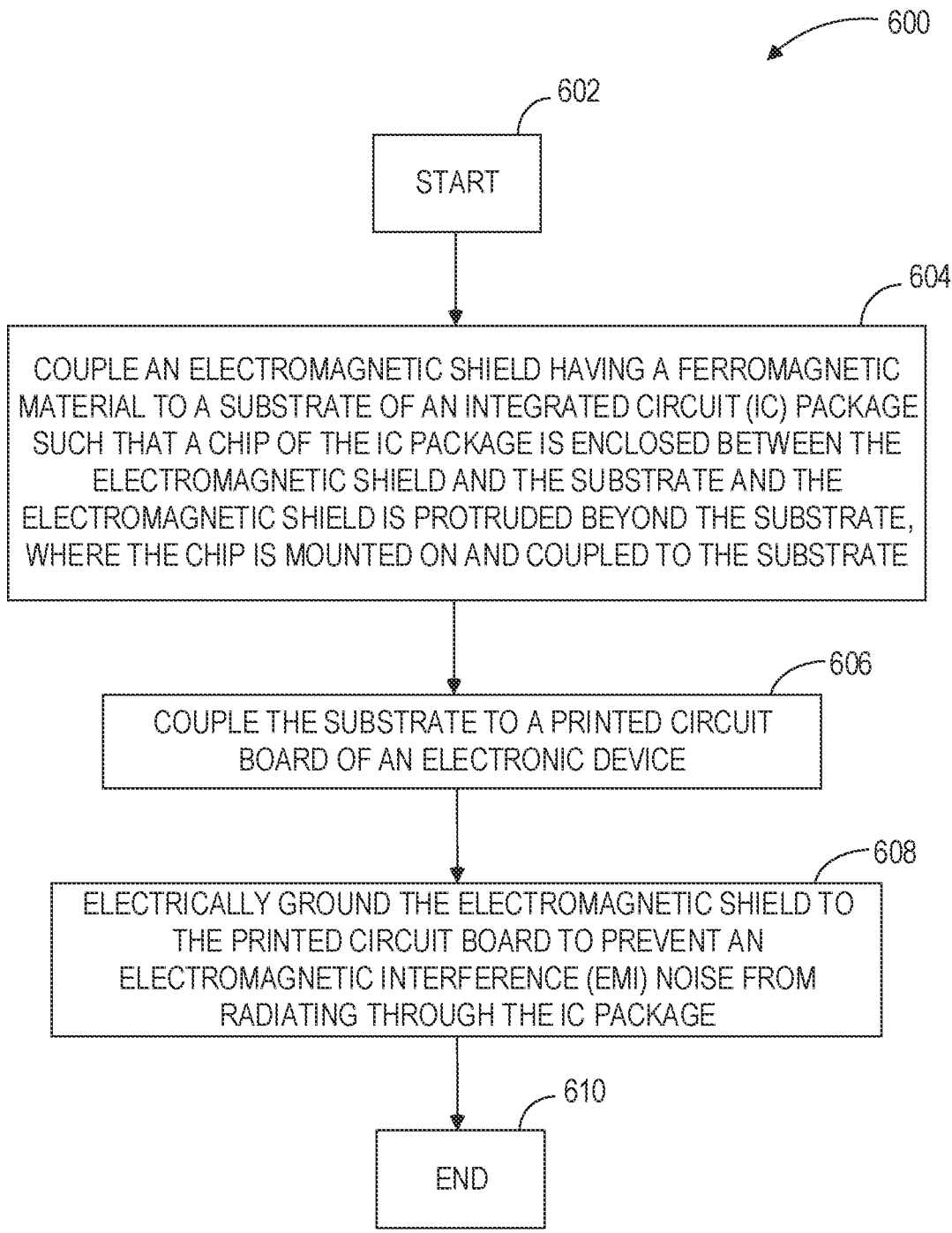
FIG. 6 is a flowchart depicting a method of assembling an IC package to a circuit board of an electronic device according to one example of the present disclosure.

FIG. 5 depicts a schematic diagram of an electronic device 550. As discussed herein the electronic device 550 may be a computer (e.g., server, storage device, etc.), networking device (e.g., transceiver, wireless access point, router, switch, etc.), or the like. In some examples, the electronic device 550 includes one or more IC packages 500, a PCB 552 (e.g., a mother board), and one or more electronic components 554. In one or more examples, the IC package 500 includes a substrate 502, a chip 504, an electromagnetic shield 506, electrical contacts 508, and a TIM 510.

The substrate 502, the chip 504, the electrical contacts 508, and the TIM 510 of the IC package 500 are similar to the substrate 102, the chip 104, the electrical contacts 108, and the TIM 110, respectively of the IC package 100 as described in the example of FIG. 1. Thus, the above descriptions of components of the IC package 100 are applicable to the similar components of the IC package 500, and thus duplicative descriptions are omitted below to improve clarity.

In some examples, the electromagnetic shield 506 may be a lid having a cover portion 518 and sidewall portions 520 extending from the cover portion 518. In some examples, the electromagnetic shield 506 may further include ferromagnetic material e.g., iron, cobalt, nickel, or the like. The electromagnetic shield 506 is mounted on and coupled to the substrate 502 such that the chip 504 and the TIM 510 are enclosed between the substrate 502 and the electromagnetic shield 506. Further, the sidewall portions 520 of the electromagnetic shield 506 protrudes outwards beyond the substrate 502, e.g., about 0.5 mm to 1 mm from the electrical contacts 508 of the substrate 502. The electromagnetic shield 506 when mounted on and coupled to the substrate 502 may protect the circuit components, e.g., the substrate 502 and the chip 504 from dust, moisture, corrosion, or other conditions which may arise in external environments.

The PCB 552 is an electronic circuit board having conductive strips 556 and grounding strips 557. The conductive strips 556 are etched along a top surface 560 of the PCB 552 and the grounding strips 557 are etched along a bottom surface 562 of the PCB 552. The grounding strips 557 may be further connected to grounding wires (not shown) of the electronic device 550. In some examples, the PCB 552 further includes through-holes 563 extending between the top surface 560 and the bottom surface 562 of the PCB 552. In one or more examples, the through-holes 563 may be formed by stamping, milling, or the like. The PCB 552 may further include through-vias 564 extending in the through-holes 563 and overlapping on a portion of the top surface 560 and the bottom surface 562 of the PCB 552. The through-vias 564 includes grounding pins 558, which may disposed contact the grounding strips 557 of the PCB 552. The conductive strips 556 may be further connected to traces (not shown) formed along the bottom surface in the PCB 552 to create electrical paths and signal paths to allow the chip 504 of the IC package 500 to communicate with other devices (not shown) that are connected to the PCB 552, execute or process instructions, receive electrical power, or the like. In one or more examples, the bottom surface 562 of the PCB 552 may be further mounted on a chassis (not shown) of the electronic device 550. In one or more examples, the electronic components 554 may include capacitors, resistors, or the like. In some examples, the plurality of electronic components 554 may be disposed spaced apart from each other and coupled to the PCB 552.

In one or more examples, a surface mounting technology (SMT) process may be used to mount the IC package 500 on the PCB 552 such that the protruded sidewall portions 520 extend through the through-vias 564 of the PCB 552, and the electrical contacts 508 are disposed contacting the conductive strips 556. For example, the sidewall portions 520 extend through the through-vias 564 to protrude beyond the substrate 502 and the electrical contacts 508, and contact the grounding pins 558 of the through-vias 564. Further, the electrical contacts 508 of the substrate 502 are coupled to the conductive strips 556 in the PCB 552. For example, a solder reflow technique may be used to couple the electrical contacts 508 to the conductive strips 556. Further, the protruded sidewall portions 520 of the electromagnetic shield 506 are coupled to the grounding pins 558 of the through-vias 564. For example, a secondary soldering technique may be used to couple the protruded sidewall portions 520 to the grounding pins 558 via solders 525. Accordingly, the protruded sidewall portions 520 of the electromagnetic shield 506 are electrically grounded to the grounding strips 557 of the PCB 552 via the grounding pins 558 in the through-vias 564 to prevent electrical fields (E-fields) from radiating through the electromagnetic shield 506. Further, the ferromagnetic material in the electromagnetic shield 506 may provide magnetic permeability properties to prevent magnetic fields (B-fields) from radiating through the electromagnetic shield 506. Accordingly, the electromagnetic shield 506 may protect the circuit components from malfunction due to EMI noise. Since the sidewall portions 520 extend through the through-vias 564 and coupled to the PCB 552, the IC package 500 is firmly attached to the PCB 552 without any risk of cracking from the PCB 552.

FIG. 6 is a flowchart depicting a method 600 of assembling the IC package to a printed circuit board (PCB) of the electronic device. It may be noted herein that the method 600 is described in conjunction with FIGS. 1-5, for example. The method 600 starts at block 602 and continues to block 604.

At block 604, the method 600 includes coupling an electromagnetic shield having a ferromagnetic material to a substrate of an IC package such that a chip of the IC package is enclosed between the electromagnetic shield and the substrate and the electromagnetic shield is protruded beyond the substrate, where the chip is mounted on and coupled to the substrate. As discussed in the example of FIG. 2, the electromagnetic shield may include a sidewall portions protruded beyond the substrate, e.g. a bottom surface of the substrate or electrical contacts of the substrate.

In some examples, coupling the electromagnetic shield to the substrate further includes thermally coupling a first section in a cover portion of the electromagnetic shield to the chip via a TIM to dissipate heat from the chip to the electromagnetic shield. In some examples, the TIM includes a ferromagnetic material to further prevent EMI noise from radiating through the IC package. Further, a second section in the cover portion has a plurality of apertures to further dissipate the heat from the chip to a cooling fluid (e.g., air). In some examples, each aperture of the plurality of apertures has a diameter of about 0.5 millimeters (mm) to about 3 mm. The method 600 continues to block 606.

At block 606, the method 600 includes coupling the substrate to a printed circuit board (PCB) of an electronic device. In some examples, coupling the substrate to the PCB includes mounting the IC package on the PCB and soldering the electrical contacts coupled to the chip and protruded from the substrate to the PCB in the substrate. For example, the electrical contacts in the substrate are soldered to conductive strips in the PCB. The electrical contacts may be one of solder balls of a ball grid array package, sockets of a land grid array package, or pins of a pin grid array package. The method 600 continues to block 608.

At block 608, the method 600 includes electrically grounding the electromagnetic shield to the PCB to prevent electromagnetic interference (EMI) noise from radiating through the IC package. In some examples, referring to the example of FIG. 2, electrically grounding the electromagnetic shield to the PCB includes disposing the sidewall portions of the electromagnetic shield on a top surface of the PCB and soldering the protruded sidewall portions to grounding pins disposed at a top surface of the PCB to electrically ground the electromagnetic shield to the PCB, and thereby prevent an electromagnetic interference (EMI) noise from radiating through the IC package. In some other examples, referring to the example of FIG. 5, electrically grounding the electromagnetic shield to the PCB includes protruding the protruded sidewall portions through through-vias of the PCB and soldering the protruded sidewall portions to grounding pins of the through-vias which are disposed in contact with grounding strips of the PCB. Accordingly, the protruded sidewall portions of the electromagnetic shield are electrically grounded to the grounding strips of the PCB via the grounding pins in the through-vias to prevent electrical fields (E-fields) from radiating through the electromagnetic shield, and thereby prevent EMI noise from radiating through the IC package. The method 600 ends at block 610.

An IC package of the present disclosure may be more economical to manufacture and maintain as compared to an external case because the IC package may require fewer elements. Further, the IC package may consume less space of an electronic device as compared to an external case. For example, the electromagnetic shield may retain a nominal height (e.g., about 2 mm to about 4 mm) on the circuit components of the IC package, thus making the IC package simpler to: i) mount a heat sink over the electromagnetic shield, ii) use a taller heat sink to mount on the electromagnetic shield to dissipate the heat from the chip, and/or iii) mount the IC package within an electronic device having a shorter height. Since the electromagnetic shield has a nominal height on the circuit components, it may further provide a stable platform to mount the heat sink over the electromagnetic shield. Further, the electromagnetic shield may retain a nominal width (e.g., 5 mm to about 25 mm) on the circuit components of the IC package, thereby providing more space on the printed circuit board to mount additional electronic components or route traces of the printed circuit board. Further, the IC package having only the electromagnetic shield and the internal TIM may decrease a thermal resistance to dissipate the heat from the chip.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. An integrated circuit (IC) package comprising:
a substrate;

a chip coupled to the substrate; and
an electromagnetic shield comprising a cover portion and sidewall portions extending from the cover portion, wherein the sidewall portions are coupled to peripheral end portions of the substrate such that the chip is enclosed between the substrate and the electromagnetic shield, wherein the electromagnetic shield comprises a ferromagnetic material, and wherein the electromagnetic shield protrudes beyond the substrate and is electrically grounded to a printed circuit board of an electronic device to prevent electromagnetic interference (EMI) noise from radiating through the IC package.

2. The IC package of claim 1, further comprising a thermal interface material (TIM) disposed between the chip and a first section in the cover portion of the electromagnetic shield, and wherein the chip is thermally coupled to the first section via the TIM to dissipate heat from the chip to the electromagnetic shield.

3. The IC package of claim 2, wherein the TIM comprises a ferromagnetic material to further prevent EMI noise from radiating through the IC package.

4. The IC package of claim 2, wherein a second section in the cover portion has a plurality of apertures to further dissipate the heat from the chip to a cooling fluid.

5. The IC package of claim 4, wherein each aperture of the plurality of apertures has a diameter of about 0.5 millimeters (mm) to about 3 mm.

6. The IC package of claim 1, wherein the sidewall portions of the electromagnetic shield protrude through through-vias of the printed circuit board and are soldered to grounding pins in the through-vias to electrically ground the electromagnetic shield to the printed circuit board through the through-vias.

7. The IC package of claim 1, wherein the sidewall portions of the electromagnetic shield are disposed on the printed circuit board and soldered to grounding pins of the printed circuit board to electrically ground the electromagnetic shield to the printed circuit board.

8. The IC package of claim 1, further comprising electrical contacts coupled to the chip and protruded from the substrate, wherein the substrate is soldered to the printed circuit board via the electrical contacts, and wherein the electrical contacts are one of solder balls of a ball grid array package, sockets of a land grid array package, or pins of a pin grid array package.

9. An electronic device, comprising:
a printed circuit board; and
an integrated circuit (IC) package mounted on the printed circuit board, wherein the IC package comprises:
a substrate coupled to the printed circuit board;
a chip coupled to the substrate; and
an electromagnetic shield comprising a cover portion and sidewall portions extending from the cover portion, wherein the sidewall portions are coupled to peripheral end portions of the substrate such that the chip is enclosed between the substrate and the electromagnetic shield, wherein the electromagnetic shield comprises a ferromagnetic material, and wherein the electromagnetic shield protrudes beyond the substrate and is electrically grounded to the printed circuit board to prevent electromagnetic interference (EMI) noise from radiating through the IC package.

10. The electronic device of claim 9, wherein the IC package further comprises a thermal interface material (TIM) disposed between the chip and a first section in the cover portion of the electromagnetic shield, and wherein the chip is thermally coupled to the first section via the TIM to dissipate heat from the chip to the electromagnetic shield.

11. The electronic device of claim 10, wherein the TIM comprises a ferromagnetic material to further prevent EMI noise from radiating through the IC package.

12. The electronic device of claim 10, wherein a second section in the cover portion has a plurality of apertures to further dissipate the heat from the chip to a cooling fluid, and wherein each aperture of the plurality of apertures has a diameter of about 0.5 millimeters (mm) to about 3 mm.

13. The electronic device of claim 10, further comprising a heat sink thermally coupled to the electromagnetic shield to further dissipate the heat from the electromagnetic shield to a cooling fluid.

14. The electronic device of claim 10, wherein the sidewall portions of the electromagnetic shield protrude through through-vias of the printed circuit board and are soldered to grounding pins in the through-vias to electrically ground the electromagnetic shield to the printed circuit board through the through-vias.

15. The electronic device of claim 9, wherein the sidewall portions of the electromagnetic shield are disposed on the printed circuit board and soldered to grounding pins of the printed circuit board to electrically ground the electromagnetic shield to the printed circuit board.

16. The electronic device of claim 10, wherein the IC package further comprises electrical contacts coupled to the chip and protruded from the substrate, wherein the substrate is soldered to the printed circuit board via the electrical contacts, and wherein the electrical contacts are one of solder balls of a ball grid array package, sockets of a land grid array package, or pins of a pin grid array package.

17. A method comprising:
coupling sidewall portions of an electromagnetic shield comprising a ferromagnetic material to peripheral end portions of a substrate of an integrated circuit (IC) package such that a chip of the IC package is enclosed between the electromagnetic shield and the substrate, and the electromagnetic shield is protruded beyond the substrate, wherein the chip is mounted on and coupled to the substrate;
coupling the substrate to a printed circuit board of an electronic device; and
electrically grounding the electromagnetic shield to the printed circuit board to prevent electromagnetic interference (EMI) noise from radiating through the IC package.

18. The method of claim 17, wherein coupling the electromagnetic shield to the substrate further comprises thermally coupling a first section in a cover portion of the electromagnetic shield to the chip via a thermal interface material (TIM) to dissipate heat from the chip to the electromagnetic shield, and wherein the TIM comprises a ferromagnetic material to further prevent EMI noise from radiating through the IC package.

19. The method of claim 18, wherein a second section in the cover portion has a plurality of apertures to further dissipate the heat from the chip to a cooling fluid, and wherein each aperture of the plurality of apertures has a diameter of about 0.5 millimeters (mm) to about 3 mm.

20. The method of claim 18, wherein coupling the substrate to the printed circuit board comprises soldering electrical contacts of the IC package coupled to the chip and protruded from the substrate to the printed circuit board, and wherein the electrical contacts are one of solder balls of a ball grid array package, sockets of a land grid array package, or pins of a pin grid array package.

* * * * *